United States Patent
Chang et al.

(10) Patent No.: US 9,443,754 B2
(45) Date of Patent: Sep. 13, 2016

(54) SEMICONDUCTOR DEVICE INCLUDING HIGH-VOLTAGE DIODE

(71) Applicant: Macronix International Co., Ltd., Hsinchu (TW)

(72) Inventors: Yu-Jui Chang, Hsinchu (TW); Cheng-Chi Lin, Toucheng Township (TW); Shih-Chin Lien, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 22 days.

(21) Appl. No.: 14/454,153

(22) Filed: Aug. 7, 2014

(65) Prior Publication Data

US 2016/0043180 A1 Feb. 11, 2016

(51) Int. Cl.
*H01L 29/808* (2006.01)
*H01L 21/337* (2006.01)
*H01L 29/78* (2006.01)
*H01L 21/336* (2006.01)
*H01L 21/331* (2006.01)
*H01L 29/73* (2006.01)
*H01L 21/768* (2006.01)
*H01L 29/06* (2006.01)
*H01L 27/06* (2006.01)
*H01L 27/08* (2006.01)
*H01L 29/423* (2006.01)
*H01L 29/08* (2006.01)
*H01L 29/10* (2006.01)

(52) U.S. Cl.
CPC ........... *H01L 21/768* (2013.01); *H01L 27/067* (2013.01); *H01L 27/0635* (2013.01); *H01L 27/0814* (2013.01); *H01L 29/0615* (2013.01); *H01L 29/0634* (2013.01); *H01L 29/7816* (2013.01); *H01L 29/7835* (2013.01); *H01L 29/0878* (2013.01); *H01L 29/1083* (2013.01); *H01L 29/1087* (2013.01); *H01L 29/42368* (2013.01)

(58) Field of Classification Search
CPC ............. H01L 29/1095; H01L 21/768; H01L 23/528; H01L 29/0615; H01L 29/66121; H01L 29/87; H01L 27/0635; H01L 27/0814; H01L 27/067; H01L 29/0634; H01L 29/7816; H01L 29/7835; H01L 29/42368; H01L 29/1083; H01L 29/0878; H01L 29/1087
USPC .................................. 257/250–260, 330–340
See application file for complete search history.

(56) References Cited

U.S. PATENT DOCUMENTS

| 7,868,387 B2 * | 1/2011 | Salcedo | H01L 27/0262 257/120 |
| 2012/0241861 A1 * | 9/2012 | Chen | H01L 29/0634 257/339 |
| 2013/0015888 A1 * | 1/2013 | Chan | H02M 1/36 327/109 |
| 2013/0265102 A1 * | 10/2013 | Lin | H01L 29/808 327/530 |

(Continued)

*Primary Examiner* — Marc Armand
*Assistant Examiner* — Nelson Garces
(74) *Attorney, Agent, or Firm* — Finnegan, Henderson, Farabow, Garrett & Dunner LLP (57) ABSTRACT

A semiconductor device includes a substrate, a high-voltage N-well (HVNW) disposed in the substrate, a bulk P-well disposed in the substrate and adjacent to an edge of the HVNW, a high-voltage (HV) diode disposed in the HVNW, the HV diode including a HV diode P-well disposed in the HVNW and spaced apart from the edge of the HVNW, and an N-well disposed in the HVNW and between the HV diode P-well and the bulk P-well. A doping concentration of the N-well is higher than a doping concentration of the HVNW.

16 Claims, 11 Drawing Sheets

(56) References Cited

U.S. PATENT DOCUMENTS

2014/0264587 A1* 9/2014 Moon ............... H01L 29/7816 257/343
2014/0339601 A1* 11/2014 Salcedo ............. H01L 27/0262 257/140
2014/0346563 A1* 11/2014 Salcedo ............. H01L 27/0262 257/173

* cited by examiner

FIG. 11 ly used in display devices, portable devices, and many other applications. Usually, integrated circuits including the ultra-high voltage semiconductor devices also include a diode that can be used as a high-voltage diode.

SEMICONDUCTOR DEVICE INCLUDING HIGH-VOLTAGE DIODE

FIELD OF THE DISCLOSURE

The present disclosure relates to a semiconductor device including a high-voltage (HV) diode and, more particularly, to a semiconductor device including a high-voltage (HV) diode connected with a parasitic PNP device.

BACKGROUND

Ultra-high voltage semiconductor devices are widely used in display devices, portable devices, and many other applications. Usually, integrated circuits including the ultra-high voltage semiconductor devices also include a diode that can be used as a high-voltage diode.

SUMMARY

According to an embodiment of the disclosure, a semiconductor device includes a substrate, a high-voltage N-well (HVNW) disposed in the substrate, a bulk P-well disposed in the substrate and adjacent to an edge of the HVNW, a high-voltage (HV) diode disposed in the HVNW, the HV diode including a HV diode P-well disposed in the HVNW and spaced apart from the edge of the HVNW, and an N-well disposed in the HVNW and between the HV diode P-well and the bulk P-well. A doping concentration of the N-well is higher than a doping concentration of the HVNW.

According to another embodiment of the disclosure, a method for fabricating a semiconductor device includes forming a high-voltage N-well (HVNW) in a substrate, forming a bulk P-well in the substrate, outside of the HVNW, and adjacent to an edge of the HVNW, forming a HV diode P-well in the HVNW and spaced apart from the edge of the HVNW, and forming an N-well in the HVNW and between the HV diode P-well and the bulk P-well, including forming the N-well to have a higher doping concentration than a doping concentration of the HVNW.

According to still another embodiment of the disclosure, an integrated circuit includes a substrate, a high-voltage N-well (HVNW) disposed in the substrate, a bulk P-well disposed outside of HVNW and surrounding the HVNW, a high-voltage (HV) diode disposed inside HVNW, and including a HV diode P-well disposed along an edge of the HVNW and spaced apart from the edge of the HVNW, and an N-well disposed along the edge of the HVNW and between the HV diode P-well and the edge of the HVNW. The N-well has a doping concentration higher than a doping concentration of the HVNW.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
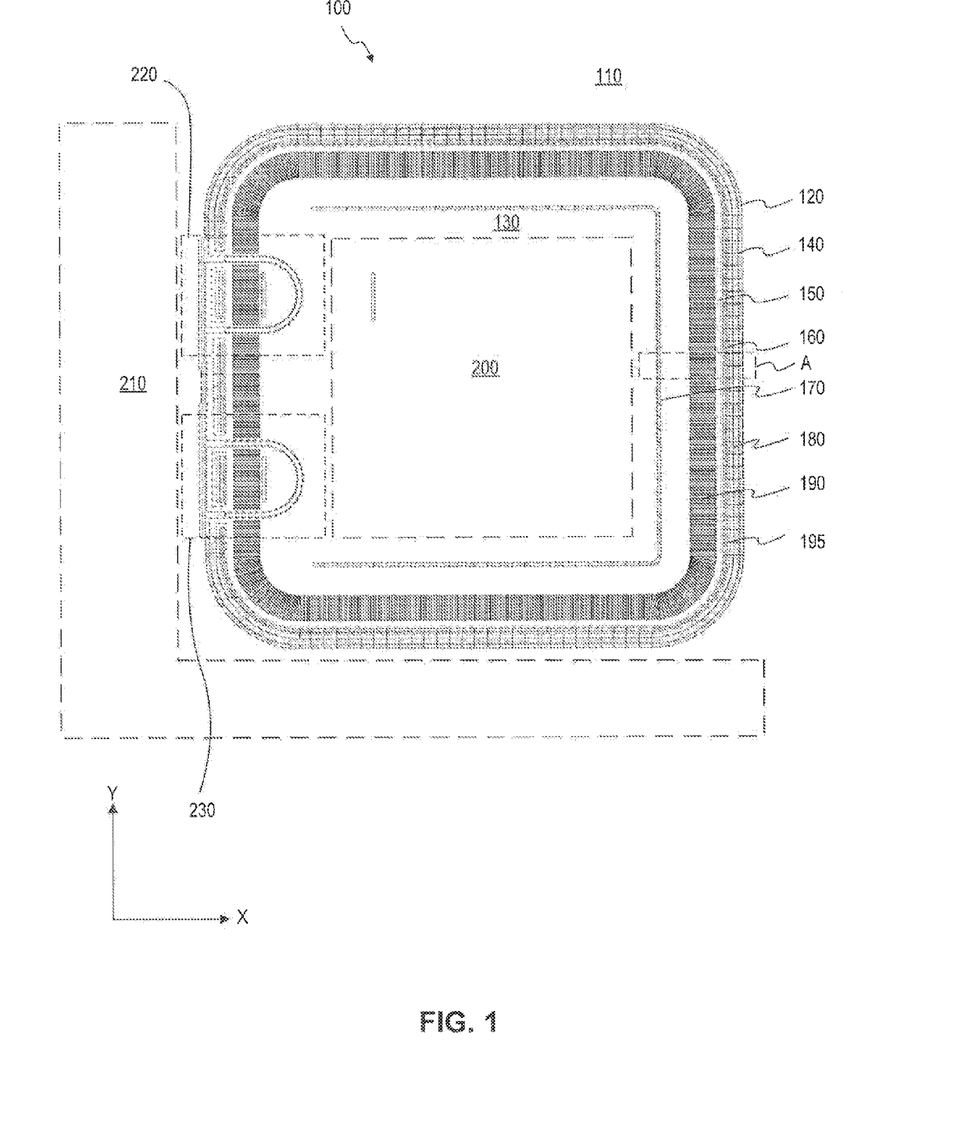
FIG. 1 is a plan view of an integrated circuit (IC) according to an illustrated embodiment of the present disclosure.
Figure 2:
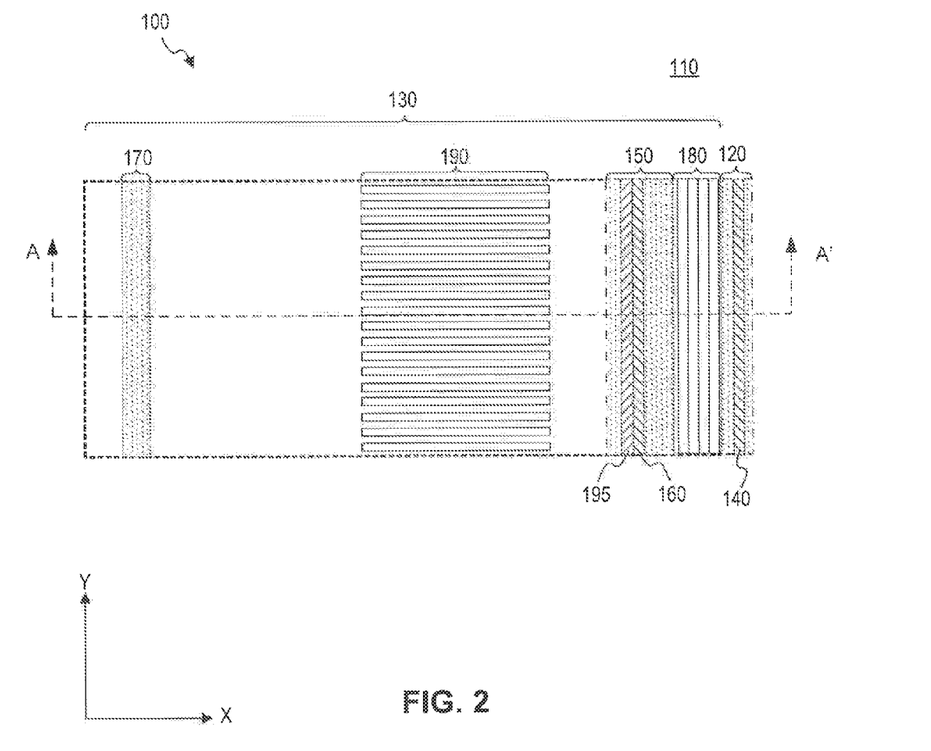
FIG. 2 is an enlarged plan view of a region A of the IC of FIG. 1, according to an illustrated embodiment of the present disclosure.
Figure 3:
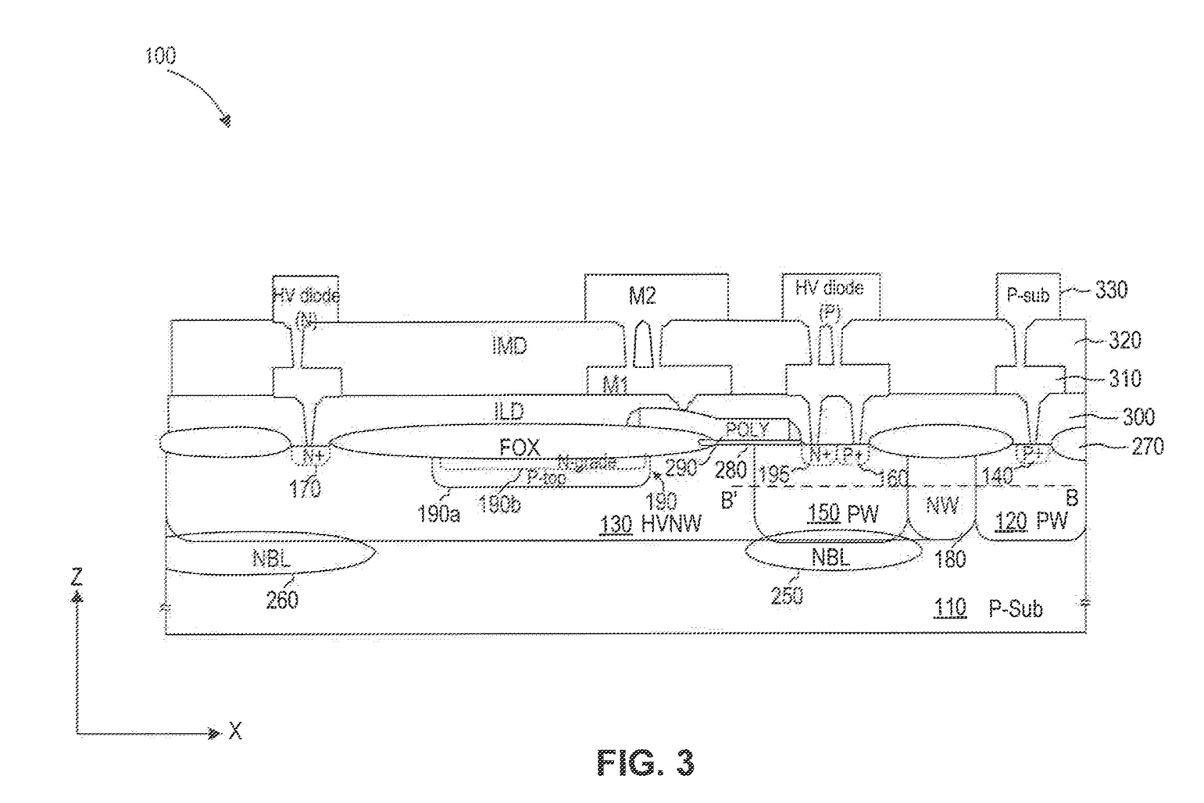
FIG. 3 is a cross-sectional view of the IC, along line A-A' of FIG. 2.

FIG. 1 is a plan view of an integrated circuit (IC) 100 according to an illustrated embodiment of the present disclosure. FIG. 2 is an enlarged plan view of region A of IC 100 according to an illustrated embodiment of the present disclosure. FIG. 3 is a cross-sectional view of IC 100 along line A-A' of FIG. 2.

With reference to FIGS. 1 and 2, IC 100 is provided on a substrate 110 having a bulk P-well 120 that surrounds a high-voltage N-well (HVNW) 130. A bulk P+-region 140 is disposed inside bulk P-well 120. A high-voltage (HV) diode is disposed inside HVNW 130. The high-voltage diode includes a HV diode P-well 150 disposed along the edge of HVNW 130 and spaced apart from the edge of HVNW 130, a HV diode P+-region 160 disposed in HV diode P-well 150, and a HV diode N+-region 170 along an upper side edge portion, a right side edge portion, and a lower side edge portion of HVNW 130, as viewed in FIG. 1. An N-well 180 is disposed adjacent to and along the edge of HVNW 130. N-well 180 is disposed adjacent to both HV diode P-well 150 and bulk P-well 120, and between HV diode P-well 150 and bulk P-well 120. A drift region 190 is disposed inside an area surrounded by HV diode P-well 150, along and spaced apart from the edge of HV diode P-well 150. A source N+-region 195 is disposed in HV diode P-well 150, adjacent to HV diode P+-region 160.

Substrate 110 includes a high voltage (HV) area 200 inside HVNW 130, and a low voltage (LV) area 210 outside of HVNW 130, and at the left side and the lower side of HVNW 130, as viewed in FIG. 1. IC 100 includes two ultra-high voltage metal-oxide-semiconductor (UHV MOS) devices 220 and 230 located between HV area 200 and LV area 210. UHV MOS devices 220 and 230 are similar in structure, but can have different operating voltages, such as gate voltages, source voltages, drain voltages, and bulk voltages. Both UHV MOS devices 220 and 230 have relatively high breakdown voltages of higher than 500 V. Although FIG. 1 only illustrates two UHV MOS devices 220 and 230, additional devices such as low-voltage metal-oxide-semiconductor (LVMOS) devices, bipolar junction transistors (BJTs), capacitors, resistors, etc., may be formed in HV area 200. The devices formed in HV area 200 are connected to a ground voltage of higher than 500 V, and have high operating voltages (e.g., greater than 500 V).

Similarly, additional devices such as LVMOS devices, BJTs, capacitors, resistors, etc., may be formed in LV area 210. The semiconductor devices formed in LV area 210 are connected to a ground voltage of about 0 V. Ground voltage as used therein refers to a reference voltage. IC 100 also includes a metal layer that surrounds HV area 200. During operation of IC 100, a boot voltage $V_B$ is applied to the metal layer.

A method of fabricating region A of IC 100 is explained below with reference to FIG. 3, which is a cross-sectional view along line A-A' in FIG. 2. First, substrate 110 is provided. Substrate 110 can be a P-type substrate. HVNW 130 is formed in a portion of substrate 110. HVNW 130 is doped with an N-type dopant (e.g., phosphorus or arsenic) at a low concentration of about $10^{13}$ to $10^{15}$ atoms/cm$^3$, in order to sustain the high operating voltages of the devices formed in HV area 200. Bulk P-well 120 is formed adjacent to a right side edge of HVNW 130. HV diode P-well 150 is formed in HVNW 130 and spaced apart from the right side edge of HVNW 130, as viewed in FIG. 3. Bulk P-well 120 and HV diode P-well 150 are doped with a P-type dopant (e.g., boron) at a concentration of about $10^{16}$ to $10^{17}$ atoms/cm$^3$. A depth of HVNW 130 is greater than 6 µm. A depth of HV diode P-well 150 is similar to the depth of HVNW 130. A first N-type buried layer (NBL) 250 is formed at a right side bottom portion of HVNW 130. First NBL 250 is vertically (i.e., along the Z-direction) overlaid with HV diode P-well 150 and is connected to a bottom portion of HV diode P-well 150. A second NBL 260 is formed at a left side bottom portion of HVNW 130, as viewed in FIG. 3. First and second NBLs 250 and 260 are doped with an N-type dopant (e.g., arsenic or antimony) at a concentration of about $10^{16}$ to $10^{17}$ atoms/cm$^3$.

N-well 180 is formed in HVNW 130, between bulk P-well 120 and HV diode P-well 150, and adjacent to bulk P-well 120 and HV diode P-well 150. A right side edge of N-well 180 is adjacent to a left side edge of bulk P-well 120, and a left side edge of N-well 180 is adjacent to a right side edge of HV diode P-well 150. N-well 180 is doped with an N-type dopant (e.g., phosphorus or arsenic) at a concentration greater than the doping concentration of HVNW 130. For example, N-well 180 is doped at a concentration of about $10^{16}$ to $10^{17}$ atoms/cm$^3$.

Bulk P+-region 140 is formed in bulk P-well 120. HV diode P+-region 160 is formed in HV diode P-well 150 and spaced apart from a right side edge of HV diode P-well 150. Bulk P+-region 140 and HV diode P+-region 160 are doped with a P-type dopant (e.g., boron) at a concentration of about $10^{18}$ to $10^{20}$ atoms/cm$^3$. HV diode N+-region 170 is formed in HVNW 130, at a left side of and spaced apart from HV diode P-well 150. Source N+-region 195 is formed in HV diode P-well 150, at a left side of and adjacent to HV diode P+-region 160. HV diode N+-region 170 and source N+-region 195 are doped with an N-type dopant (e.g., phosphorus or arsenic) at a concentration of about $10^{18}$ to $10^{20}$ atoms/cm$^2$. HV diode P+-region 160 and HV diode N+-region 170 constitute a HV diode.

Drift region 190 is formed in HVNW 130, between HV diode P-well 150 and HV diode N+-region 170, and spaced apart from HV diode P-well 150 and HV diode N+-region 170. Drift region 190 includes a plurality of first sections and second sections alternately arranged along a channel width direction of UHV MOS device 220 (i.e., Y direction illustrated in FIG. 2). Each one of the first sections includes a P-top layer 190a and an N-grade layer 190b formed on top of P-top layer 190a. Each one of the second sections does not include any P-top layer or N-grade layer. P-top layer 190a is doped by a P-type dopant (e.g., boron) at a concentration of about $10^{13}$ to $10^{16}$ atoms/cm$^3$. N-grade layer 190b is doped by an N-type dopant (e.g., phosphorus or arsenic) at a concentration of about $10^{13}$ to $10^{16}$ atoms/cm$^3$.

An insulating layer 270 is formed over substrate 110. Insulating layer 270 can be formed of field oxide (FOX). A plurality of openings are formed in insulating layer 270 to respectively expose HV diode N+-region 170, source N+-region 195, bulk P+-region 140, and HV diode P+-region 160. A gate oxide layer 280 is formed over substrate 110, covering a region of substrate 110 between source N+-region 195 and a portion of insulating layer 270 covering drift region 190. A gate layer 290 is formed over substrate 110 and covers gate oxide layer 280. Gate layer 290 can be formed of polysilicon.

An interlayer dielectric (ILD) layer 300 is formed over substrate 110. ILD layer 300 is etched to form through holes, for forming contacts, that respectively correspond to HV diode N+-region 170, gate layer 290, source N+-region 195, bulk P+-region 140, and HV diode P+-region 160. A first metal (M1) layer 310 is formed over ILD layer 300. M1 layer 310 is patterned to form electrically and physically isolated portions that respectively overlap and connect to HV diode N+-region 170, gate layer 290, source N+-region 195 and bulk P+-region 140, and HV diode P+-region 160, through the through-holes formed in ILD layer 300. An inter-metal dielectric (ND) layer 320 is formed over M1 layer 310 and has through holes, to serve as vias, respectively corresponding to the isolated portions of M1 layer 310. A second metal (M2) layer 330 is formed over IMD layer 320 and includes electrically and physically isolated portions that respectively overlap and connect to the isolated portions of M1 layer 310, by means of the vias.

Figure 4:
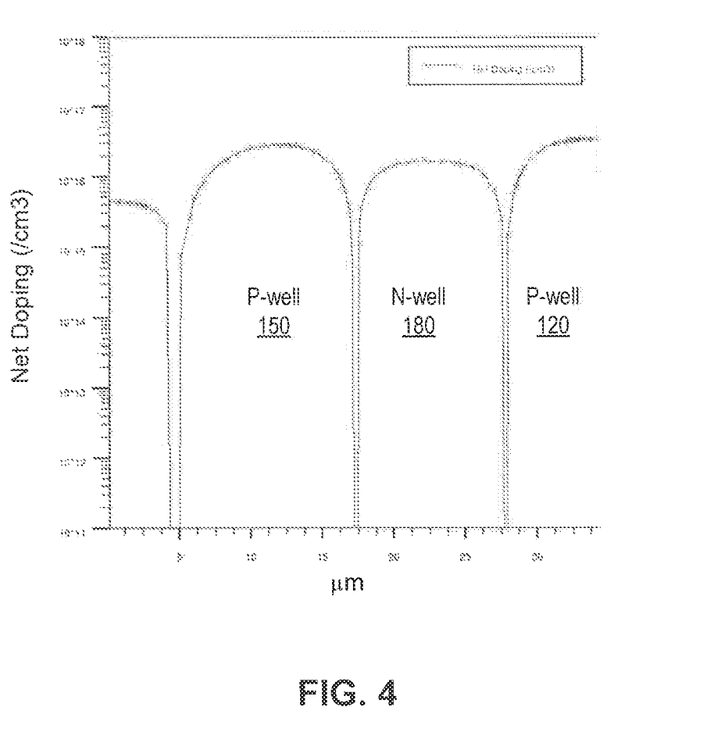
FIG. 4 is a net doping profile of the IC, along line B-B' of FIG. 3, according to an illustrated embodiment of the present disclosure.

FIG. 4 is a net doping profile of IC 100 along line B-B' of FIG. 3, according to an illustrated embodiment of the present disclosure. The net doping profile is obtained from computer simulation. With reference to FIG. 4, N-well 180 has a peak doping concentration of about $2 \times 10^{16}$ atoms/cm$^3$, HVNW 130 has a peak doping concentration of about $4 \times 10^{15}$ atoms/cm$^3$, and both bulk P-well 120 and HV diode P-well 150 have a peak doping concentration of about $3 \times 10^{16}$ atoms/cm$^3$. The abscissa scale in the graph of FIG. 4 represents the distance along the X-direction from a given point located at the left side of HV diode P-well 150.

Figure 5:
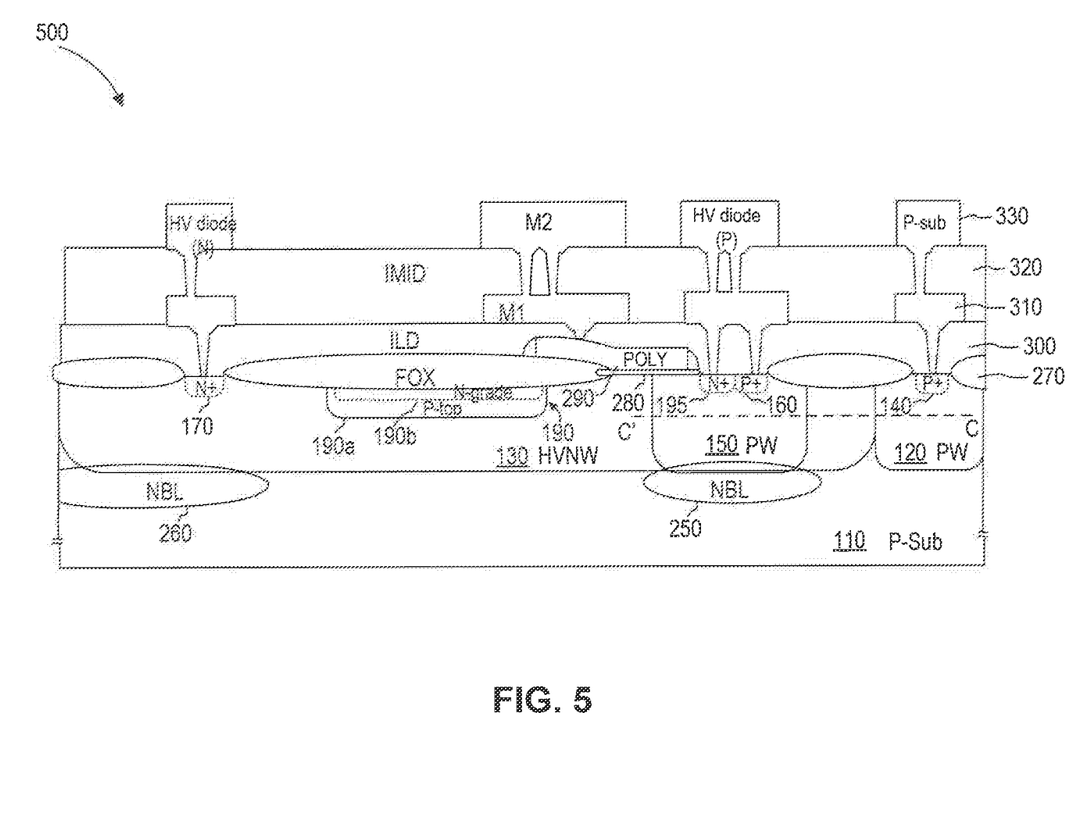
FIG. 5 is a cross-sectional view of an IC, according to a comparative example.
Figure 6:
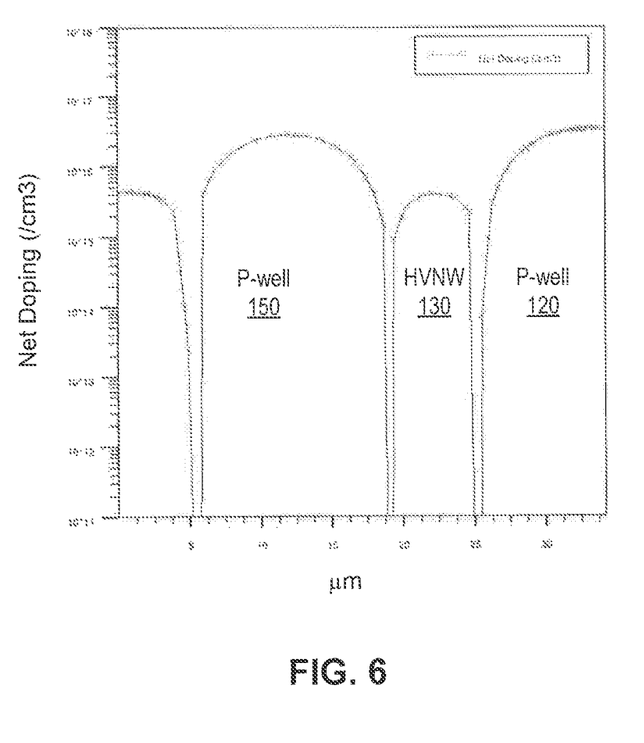
FIG. 6 is a net doping profile of the IC of FIG. 5, along line C-C' of FIG. 5.

FIG. 5 is a cross-sectional view of an IC 500, according to a comparative example. FIG. 6 is a net doping profile of IC 500 along line C-C' of FIG. 5. The structure of IC 500 is similar to that of IC 100 except that no N-well is formed between bulk P-well 120 and HV diode P-well 150. With reference to FIG. 6, HVNW 130 has a peak doping concentration of about $4 \times 10^{15}$ atoms/cm$^3$, and both bulk P-well 120 and HV diode P-well 150 have a peak doping concentration of about $3 \times 10^{16}$ atoms/cm$^3$.

IC 500 includes a parasitic PNP transistor constituted by bulk P-well 120 (P), a portion of HVNW 130 (N) between bulk P-well 120 and HV diode P-well 150, and HV diode P-well 150 (P). Bulk P-well 120 functions as a collector of the parasitic PNP transistor. The portion of the HVNW 130 functions as a base of the parasitic PNP transistor. HV diode P-well 150 functions as an emitter of the parasitic PNP transistor. When a forward bias of about 8.5 V is applied to HV diode P-well 150 with respect to HVNW 130, and when a small current (i.e., a base current) flows in HV diode N+-region 170, because the doping concentration of the base (i.e., the portion of HVNW 130) of the parasitic PNP transistor is relatively low in order to sustain the high operation voltage of the devices formed in HV area 200, the current gain of the parasitic PNP transistor (i.e., the ratio of collector and base current) is relatively large. As a result, the amount of current that flows from the base to the collector of the PNP transistor (i.e., leakage current) is large.

On the other hand, IC 100 includes a parasitic PNP transistor constituted by bulk P-well 120 (P), N-well 180 (N), and HV diode P-well 150 (P). When a forward bias of about 8.5 V is applied to HV diode P-well 150 with respect to HVNW 130, and when a small current (i.e., a base current) flows in HV diode N+-region 170, because the doping concentration of the base (i.e., the portion of HVNW 130) of the parasitic PNP transistor is relatively high, the current gain of the parasitic PNP transistor is relatively small. As a result, the amount of current that flows from the base to the collector of the PNP transistor (i.e., leakage current) is relatively small.

The advantage provided by N-well 180 in IC 100 is further explained with reference to the following experiment. In the experiment, a first device was fabricated to have a structure as illustrated FIGS. 1-3, as an Example. The doping of the first device was controlled to have a net doping profile as illustrated in FIG. 4. A second device was fabricated to have a structure as illustrated in FIG. 5, as a Comparative Example. The doping of the second device was controlled to have a net doping profile as illustrated in FIG. 6.

A first high temperature operating life (HTOL) test was performed on the first device as the Example and the second device as the Comparative Example. The first HTOL test evaluated the reliability of these devices at a high temperature condition over an extended period of time. During the first HTOL test, the first and second devices were forward biased at a temperature of 140° C. for 20 hours. That is, in each of the first and second devices, bulk P+-region 140 was connected to ground, and a constant voltage of 8.5 V was applied to HV diode P+-region 160 at a temperature of 140° C. for 20 hours. Before and after the first HTOL test, the constant voltage of 8.5 V was applied to HV diode P+-region 160, a positive electrical current $I_{boot}$ having various magnitudes was applied to HV diode N+-region 170 such that HV diode P+-region 160 is forward biased relative to NW 180 and HVNW 130, and leakage current $I_{gnd}$ at bulk P+-region 140 was measured. Current $I_{boot}$ flows from HV diode N+-region 170 to NW 180 through HVNW 130 and NBL 250. As explained previously, a PNP transistor is constituted by bulk P-well 120 (P-collector), the portion of HVNW 130 (N) between bulk P-well 120 and HV diode P-well 150 (N-base), and HV diode P-well 150 (P-emitter). Current $I_{boot}$ is the base current of the PNP transistor, and current $I_{gnd}$ is the collector current of the PNP transistor. It is desirable for current $I_{gnd}$ to be as low as possible. In other words, it is desirable for the current gain (the ratio of collector to base current) of the PNP transistor to be as low as possible. The current gain is affected by ambient temperature such that the higher the temperature, the greater the current gain.

Table 1 summarizes the first HTOL test result for the Example and the Comparative Example. In Table 1, Hfe represents a gain of the leakage current $I_{gnd}$, which is calculated by $I_{gnd}/(I_{gnd}-I_{gnd,initial})$, wherein $I_{gnd,initial}$ is the initial leakage current $I_{gnd}$ measured when $I_{boot}$ is 0 μA.

TABLE 1

| | HTOL test @140° C., 20 hrs | | | | | | | |
|---|---|---|---|---|---|---|---|---|
| | Comparative Example | | | | Example | | | |
| | Before HTOL | | After HTOL | | Before HTOL | | After HTOL | |
| $I_{boot}$ (μA) | $I_{gnd}$ (μA) | Hfe | $I_{gnd}$ (μA) | Hfe | $I_{gnd}$ (μA) | Hfe | $I_{gnd}$ (μA) | Hfe |
| 0 | 95 | | 96 | | 89 | | 89 | |
| 30 | 142 | 1.57 | 263 | 5.57 | 138 | 1.63 | 139 | 1.67 |
| 60 | 195 | 1.67 | 351 | 4.25 | 197 | 1.80 | 197 | 1.80 |
| 90 | 248 | 1.70 | 433 | 3.74 | 256 | 1.86 | 256 | 1.86 |
| 140 | 304 | 1.74 | 504 | 3.40 | 317 | 1.90 | 318 | 1.91 |
| 200 | 359 | 1.76 | 574 | 3.19 | 380 | 1.94 | 380 | 1.94 |

Figure 7:
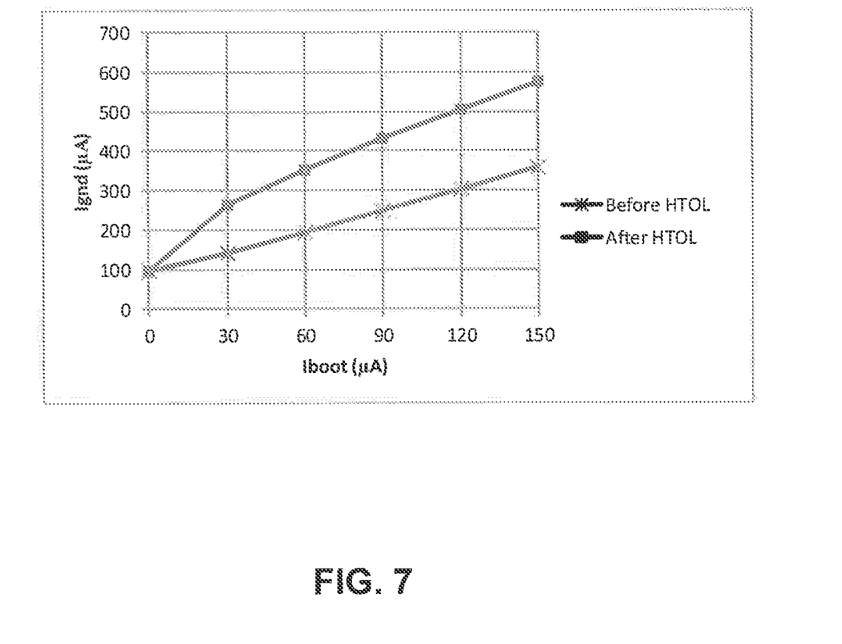
FIG. 7 is a graph showing $I_{gnd}$ versus $I_{boot}$ measured before and after a high temperature operating life (HTOL) test on a device fabricated according to FIG. 5, as a Comparative Example.
Figure 8:
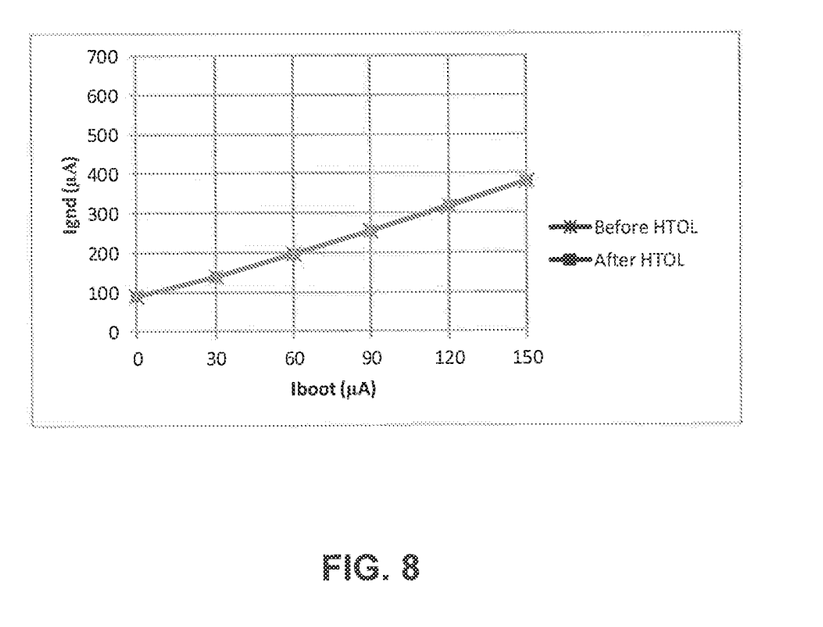
FIG. 8 is a graph showing $I_{gnd}$ versus $I_{boot}$ measured before and after a first HTOL test on a device fabricated according to FIG. 3, as an Example.

FIG. 7 is a graph showing $I_{gnd}$ versus $I_{boot}$ measured before and after the first HTOL test on the second device of the Comparative Example. FIG. 8 is a graph showing $I_{gnd}$ versus $I_{boot}$ measured before and after the first HTOL test on the first device of the Example.

According to Table 1 and FIGS. 7 and 8, the leakage current $I_{gnd}$ of the second device of the Comparative Example became larger after the second device was forward biased at 140° C. for 20 hours. On the other hand, the leakage current $I_{gnd}$ of the first device of the Example remained almost unchanged after the first device was forward biased at 140° C. for 20 hours.

A second high temperature operating life (HTOL) test was performed on a third device fabricated with a structure as illustrated FIGS. 1-3, as an Example of the disclosed embodiment. During the second HTOL test, the third device was forward biased at a temperature of 140° C. for 100 hours. The biasing condition of the second HTOL test is the same as that of the first HTOL test. Before and after the second HTOL test, the constant voltage of 8.5 V was applied to HV diode P+-region 160, a positive electrical current $I_{boot}$ having various magnitudes was applied to HV diode N+-region 170, and leakage current $I_{gnd}$ at bulk P+-region 140 was measured.

Table 2 summarizes the second HTOL test result for the Example.

TABLE 2

| | HTOL test @140° C., 100 hrs | | | | |
|---|---|---|---|---|---|
| | Example | | | | |
| | Before HTOL | | | After HTOL | |
| $I_{boot}$ (μA) | $I_{gnd}$ (μA) | Hfe | | $I_{gnd}$ (μA) | Hfe |
| 0 | 83 | | | 82 | |
| 30 | 128 | 1.5 | | 210 | 1.60 |
| 60 | 183 | 1.67 | | 185 | 1.72 |
| 90 | 238 | 1.72 | | 190a | 1.78 |
| 140 | 297 | 1.78 | | 303 | 1.84 |
| 200 | 356 | 1.82 | | 363 | 1.87 |

Figure 9:
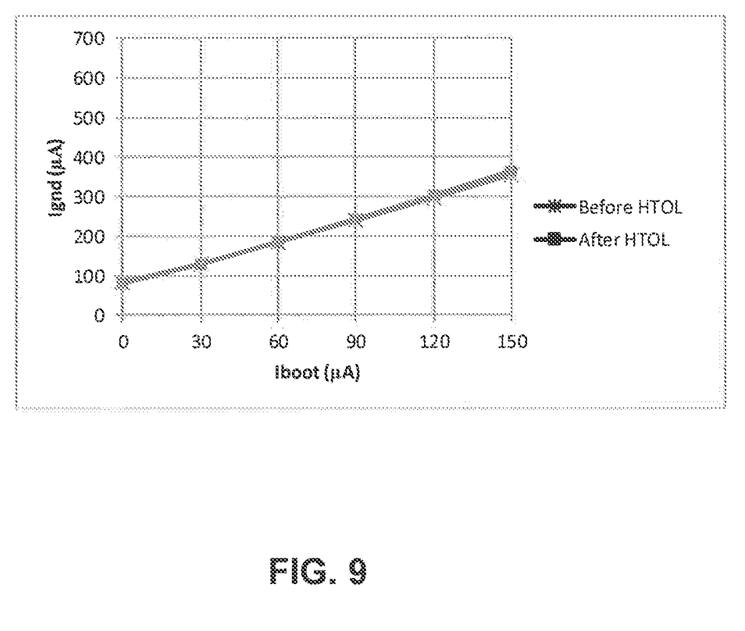
FIG. 9 is a graph showing $I_{gnd}$ versus $I_{boot}$ measured before and after a second HTOL test on a device fabricated according to FIG. 3, as an Example.

FIG. 9 is a graph showing $I_{gnd}$ versus $I_{boot}$ measured before and after the second HTOL test on the third device of the Example. According to Table 2 and FIG. 9, the leakage current $I_{gnd}$ of the third device of the Example remained almost unchanged after the third device was forward biased at 140° C. for 100 hours.

Figure 10:
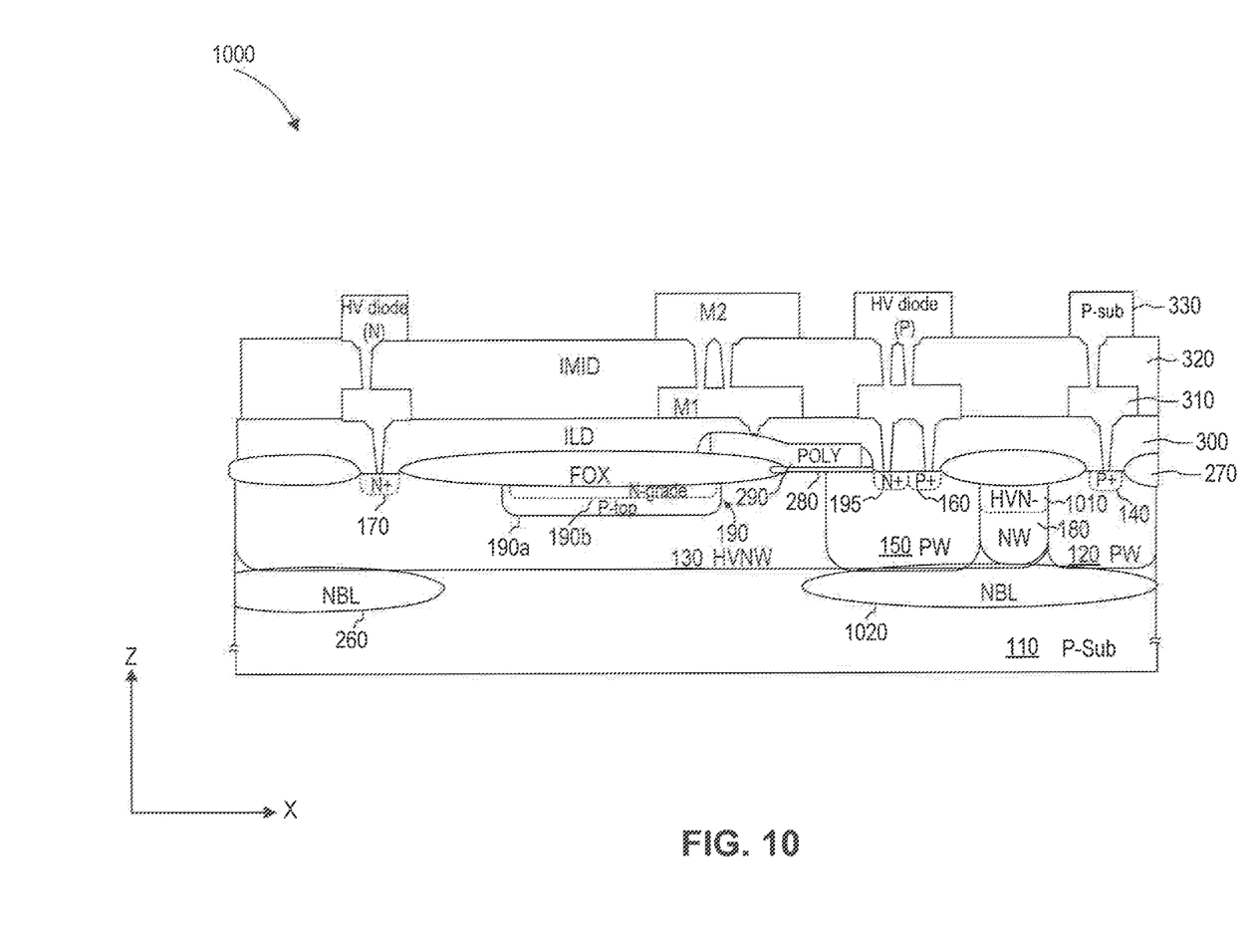
FIG. 10 is a cross-sectional view of an IC according to another illustrated embodiment of the present disclosure.

FIG. 10 is a cross-sectional view of an IC 1000 according to another embodiment of the present disclosure. The structure of IC 1000 is similar to that of IC 100 except that an additional N-well 1010 is formed on top of N-well 180, between bulk P-well 120 and HV diode P-well 150. N-well 1010 can be formed after forming N-well 180, by ion implantation. In addition, compared to first NBL 250 in IC 100, an NBL 1020 extends further to the right side of substrate 110, vertically (i.e., along the Z-direction) overlaid with HV diode P-well 150, N-well 180, and bulk P-well 120. A doping concentration of N-well 1010 is larger than that of N-well 180, in order to further isolate HV diode P-well 150 from bulk P-well 120 because current almost flows at the surface of N-well 180.

Figure 11:
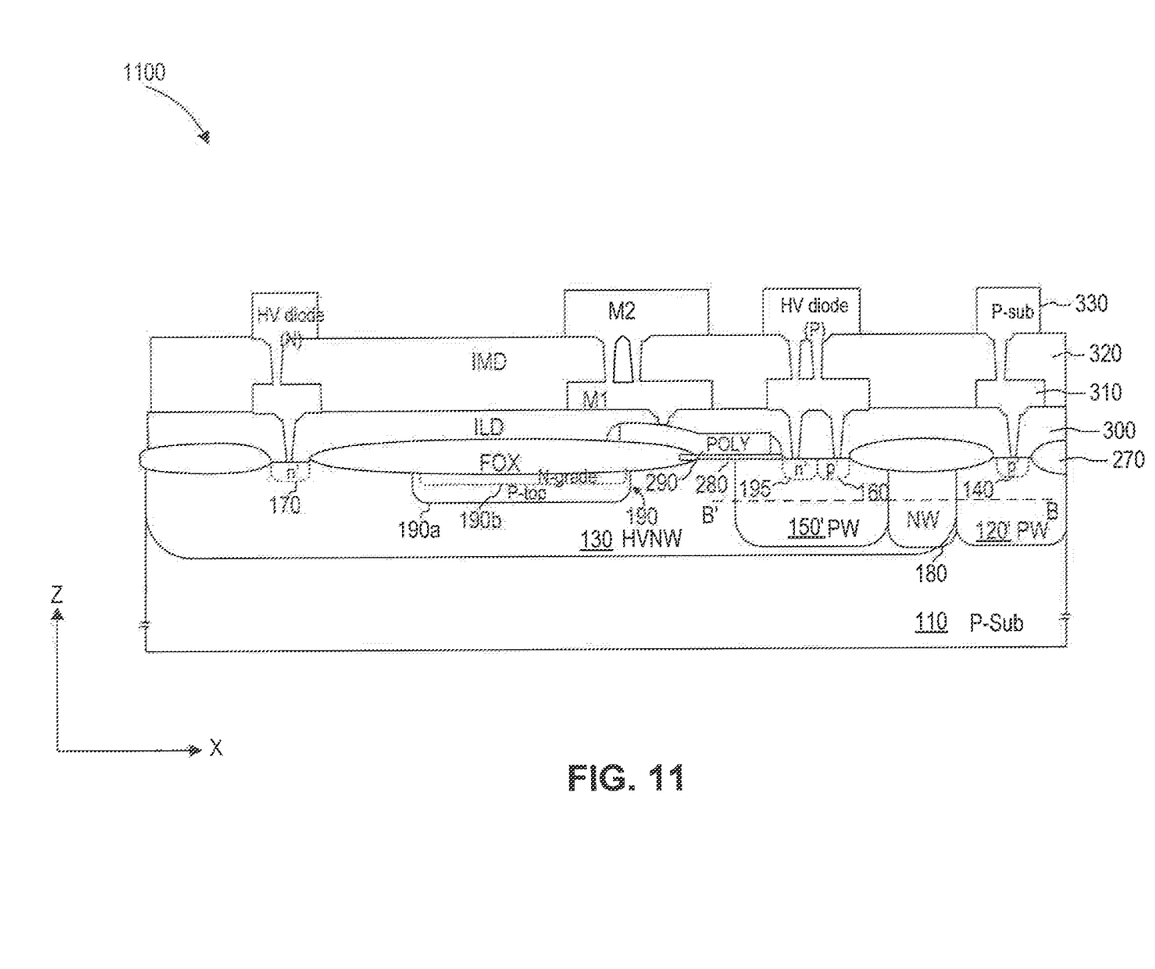
FIG. 11 is a cross-sectional view of an IC according to still another embodiment of the present disclosure.

FIG. 11 is a cross-sectional view of an IC 1100 according to another embodiment of the present disclosure. The structure of IC 1100 is similar to that of IC 100 except that the depths of bulk P-well 120' and HV diode P-well 150' are less than the depth of HVNW 130. As a result of the shallow bulk P-well 120' and shallow HV diode P-well 150', IC 1100 does not include any NBL.

While IC 100 in the embodiment described above is provided on a P-type semiconductor substrate, those skilled in the art will now appreciate that the disclosed concepts are also applicable to ICs provided on other suitable substrates, such as semiconductor on insulator (SOI) substrates.

While insulation layer 270 of IC 100 in the embodiment described above is made of field oxide, insulation layer 250 can be made of other suitable dielectric insulating structures, such as a shallow trench isolation (STI) structure.

While IC 100 in the embodiment described above includes two metal layers, i.e., M1 layer 310 and M2 layer 330, those skilled in the art will now appreciate that the disclosed concepts are also applicable to ICs including any number of metal layers, e.g., a single metal layer, or three or more metal layers.

While IC 100 in the embodiment described above includes a drift region 190 including P-top layer 190a and N-grade layer 190b, those skilled in the art will now appreciate that the disclosed concepts are also applicable to ICs including a drift region that does not include a P-top layer and an N-grade layer.

ICs 100, 1000, and 1100 in the embodiments described above can be applied as high-voltage switching devices for various applications such as, for example, light emitting diode (LED) lighting, energy saving lamps, ballast applications, and motor driver applications.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A semiconductor device, comprising:
a substrate;
a high-voltage N-well (HVNW) disposed in the substrate;
a bulk P-well disposed in the substrate and adjacent to an edge of the HVNW;
a high-voltage (HV) diode disposed in the HVNW, the HV diode including a HV diode P-well disposed in the HVNW and spaced apart from the edge of the HVNW;
an N-well disposed in the HVNW and between the HV diode P-well and the bulk P-well; and
a bulk P+-region disposed in the bulk P-well,
wherein a doping concentration of the N-well is higher than a doping concentration of the HVNW,
the N-well is in contact with the HV diode P-well and the bulk P-well,
the HV diode further includes:
a HV diode P+-region disposed in the HV diode P-well; and
a HV diode N+-region disposed in the HVNW and spaced apart from the HV diode P-well, and
the HV diode P-well is disposed between the HV diode N+-region and the edge of the HVNW.

2. The semiconductor device of claim 1, further including:
an insulation layer disposed over the substrate and including openings respectively exposing the HV diode N+-region, the HV diode P+-region, and the bulk P+-region; and
a metal layer disposed over the insulation layer and including isolated portions respectively connected to the HV diode N+-region, the HV diode P+-region, and the bulk P+-region.

3. The semiconductor device of claim 2, wherein the insulation layer is a first insulation layer, and the metal layer is a first metal layer, the semiconductor device further including:
an additional insulation layer disposed over the first metal layer; and
an additional metal layer disposed over the additional insulation layer.

4. The semiconductor device of claim 1, wherein the N-well is a first N-well, the semiconductor device including:
a second N-well disposed on top of the first N-well,
the doping concentration of the first N-well being higher than a doping concentration of the second N-well.

5. The semiconductor device of claim 1, further including a drift region disposed between the HV diode N+-region and the HV diode P-well.

6. The semiconductor device of claim 1, wherein a depth of the HV diode P-well is similar to the depth of HVNW, and
the semiconductor device further includes an N-type buried layer (NBL) vertically overlaid with and connected to a bottom portion of the HV diode P-well.

7. The semiconductor device of claim 1, wherein a depth of the HV diode P-well is less than a depth of HVNW.

8. A method for fabricating a semiconductor device, comprising:
forming a high-voltage N-well (HVNW) in a substrate;
forming a bulk P-well in the substrate, outside of the HVNW, and adjacent to an edge of the HVNW;
forming a HV diode P-well in the HVNW and spaced apart from the edge of the HVNW;
forming an N-well in the HVNW, between the HV diode P-well and the bulk P-well, and in contact with the HV diode P-well and the bulk P-well, including forming the N-well to have a higher doping concentration than a doping concentration of the HVNW;
forming a bulk P+-region in the bulk P-well;
forming a HV diode P+-region in the HV diode P-well; and
forming a HV diode N+-region in the HVNW and spaced apart from the HV diode P-well, so that the HV diode P-well is disposed between the HV diode N+-region and the edge of the HVNW.

9. The method of claim 8, further including:
forming an insulation layer over the substrate, the insulation layer including openings respectively exposing the HV diode N+-region, the HV diode P+-region, and the bulk P+-region; and
forming a metal layer over the insulation layer, the metal layer including isolated portions respectively connected to the HV diode N+-region, the HV diode P+-region, and the bulk P+-region.

10. The method of claim 9, wherein the insulation layer is a first insulation layer, and the metal layer is a first metal layer, and the method further includes:
   forming an additional insulation layer over the first metal layer; and
   forming an additional metal layer over the additional insulation layer.

11. The method of claim 8, wherein the N-well is a first N-well, the method further including:
   forming a second N-well on top of the first N-well, the doping concentration of the first N-well being higher than a doping concentration of the second N-well.

12. The method of claim 8, further including:
   forming a drift region between the HV diode N+-region and the HV diode P-well.

13. The method of claim 8, wherein a depth of the HV diode P-well is greater than a depth of HVNW, and the method further includes:
   forming an N-type buried layer (NBL) vertically overlaid with and connected to a bottom portion of the HV diode P-well.

14. The method of claim 8, wherein a depth of the HV diode P-well is less than a depth of HVNW.

15. An integrated circuit, comprising:
   a substrate;
   a high-voltage N-well (HVNW) disposed in the substrate;
   a bulk P-well disposed outside of HVNW and surrounding the HVNW;
   a high-voltage (HV) diode disposed inside HVNW, and including a HV diode P-well disposed along an edge of the HVNW and spaced apart from the edge of the HVNW; and
   an N-well disposed along the edge of the HVNW and between the HV diode P-well and the edge of the HVNW,
   wherein the N-well has a doping concentration higher than a doping concentration of the HVNW,
   the N-well is in contact with the HV-diode P-well and the bulk P-well, and
   the HV diode further includes:
      a HV diode P+-region disposed in the HV diode P-well;
      a HV diode N+-region disposed in the HVNW and spaced apart from the HV diode P-well.

16. The integrated circuit of claim 15, wherein the substrate includes a high-voltage area disposed inside the HVNW, and a low-voltage area disposed outside of the HVNW.

\* \* \* \* \*